(12) United States Patent
Komada

(10) Patent No.: US 9,450,150 B2
(45) Date of Patent: Sep. 20, 2016

(54) NITRIDE SEMICONDUCTOR LIGHT-EMITTING ELEMENT

(71) Applicant: Sharp Kabushiki Kaisha, Osaka-shi, Osaka (JP)

(72) Inventor: Satoshi Komada, Osaka (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 0 days.

(21) Appl. No.: 14/400,625

(22) PCT Filed: Sep. 5, 2013

(86) PCT No.: PCT/JP2013/073904
§ 371 (c)(1),
(2) Date: Nov. 12, 2014

(87) PCT Pub. No.: WO2014/065019
PCT Pub. Date: May 1, 2014

(65) Prior Publication Data
US 2015/0137173 A1 May 21, 2015

(30) Foreign Application Priority Data

Oct. 22, 2012 (JP) ................................ 2012-232681

(51) Int. Cl.
| H01L 33/02 | (2010.01) |
| H01L 33/32 | (2010.01) |
| H01L 33/20 | (2010.01) |
| H01L 33/00 | (2010.01) |

(52) U.S. Cl.
CPC ........... H01L 33/325 (2013.01); H01L 33/025 (2013.01); H01L 33/20 (2013.01); *H01L 33/007* (2013.01)

(58) Field of Classification Search
CPC ... H01L 33/025; H01L 33/325; H01L 33/20; H01L 33/007; H01L 21/0242; H01L 21/02458; H01L 21/0262; H01L 21/02433; H01L 21/0243; H01L 21/02494; H01L 21/0254

See application file for complete search history.

(56) References Cited

U.S. PATENT DOCUMENTS

| 6,316,785 | B1 * | 11/2001 | Nunoue et al. ................ 257/14 |
| 8,237,194 | B2 * | 8/2012 | Yoshida et al. .............. 257/183 |
| 2006/0273333 | A1 * | 12/2006 | Wu et al. ....................... 257/94 |
| 2008/0128707 | A1 | 6/2008 | Horino | |
| 2009/0166649 | A1 * | 7/2009 | Lee ...................... H01L 33/007 257/94 |
| 2009/0278158 | A1 * | 11/2009 | Fukunaga et al. ............ 257/99 |
| 2010/0019255 | A1 * | 1/2010 | Karino ................ B82Y 20/00 257/94 |

(Continued)

FOREIGN PATENT DOCUMENTS

| JP | 6-196757 | 7/1994 |
| JP | 2004-47764 | 2/2004 |

(Continued)

OTHER PUBLICATIONS

International Search Report mailed Oct. 15, 2013, directed to International Application No. PCT/JP2013/073904; 2 pgs.

*Primary Examiner* — Jarrett Stark
*Assistant Examiner* — Bitew Dinke
(74) *Attorney, Agent, or Firm* — Morrison & Foerster LLP

(57) ABSTRACT

A nitride semiconductor light-emitting element including a high concentration silicon-doped layer doped with silicon at a high concentration of $2 \times 10^{19}$ atoms/cm$^3$, and a dislocation reduction layer for laterally bending a threading dislocation on the high concentration silicon-doped layer.

5 Claims, 7 Drawing Sheets

(56) References Cited

U.S. PATENT DOCUMENTS

| | | | |
|---|---|---|---|
| 2010/0248455 A1* | 9/2010 | Okuno | H01L 21/0242 |
| | | | 438/478 |
| 2010/0252850 A1* | 10/2010 | Park et al. | 257/98 |
| 2011/0049544 A1* | 3/2011 | Komada | 257/97 |
| 2011/0121334 A1* | 5/2011 | Dai et al. | 257/98 |
| 2012/0083063 A1* | 4/2012 | Shinoda et al. | 438/47 |
| 2012/0205783 A1* | 8/2012 | Lee et al. | 257/618 |
| 2012/0319080 A1* | 12/2012 | Fudeta | H01L 33/32 |
| | | | 257/13 |
| 2013/0089973 A1* | 4/2013 | Komada | 438/479 |
| 2013/0221367 A1* | 8/2013 | Furuki et al. | 257/76 |
| 2013/0277684 A1* | 10/2013 | Araki et al. | 257/76 |

FOREIGN PATENT DOCUMENTS

| | | | |
|---|---|---|---|
| JP | 2004047764 A * | 2/2004 | H01L 21/20 |
| JP | 2006-60164 | 3/2006 | |
| JP | 2008-141005 | 6/2008 | |
| JP | WO 2011102411 A1 * | 8/2011 | H01L 33/12 |
| WO | WO 2012090818 A1 * | 7/2012 | |

\* cited by examiner

NITRIDE SEMICONDUCTOR LIGHT-EMITTING ELEMENT

CROSS-REFERENCE TO RELATED APPLICATIONS

This application is a national phase filing under 35 U.S.C. §371 of International Application No. PCT/JP2013/073904, filed on Sep. 5, 2013, and which claims priority to Japanese Patent Application No. 2012-232681, filed on Oct. 22, 2012, the contents of which prior applications are incorporated herein by reference.

FIELD OF THE INVENTION

The present invention relates to a nitride semiconductor light-emitting element.

BACKGROUND OF THE INVENTION

Conventionally, substrates for use in a nitride semiconductor light-emitting element may include a GaN substrate, an SiC substrate, a sapphire substrate, and the like. Among those substrates, a sapphire substrate is widely used which has a predominance in price and mass productivity.

However, conventionally, there has been a problem of difficulty in growing a nitride semiconductor layer of GaN or the like on a sapphire substrate due to a lattice mismatching rate between the sapphire substrate and the nitride semiconductor layer of GaN or the like.

Therefore, for example, PTD 1 (Japanese Patent Laying-Open No. 6-196757) proposes a method of forming a low-temperature GaN buffer layer on a sapphire substrate and thereby growing a high-quality GaN layer on the low-temperature GaN buffer layer.

PATENT DOCUMENT

PTD 1: Japanese Patent Laying-Open No. 6-196757

SUMMARY OF THE INVENTION

However, even in the case where the low-temperature GaN buffer layer is formed on the sapphire substrate, a threading dislocation of the GaN layer growing on the low-temperature GaN buffer layer still exists at a density of at least $1 \times 10^{18}$ atoms/cm$^2$.

Such a threading dislocation causes an increased leakage current and a lowered luminous efficiency in a nitride semiconductor light-emitting diode element, and also causes a shortened life in a nitride semiconductor laser element.

In light of the circumstance described above, an object of the present invention is to provide a nitride semiconductor light-emitting element capable of improving characteristics by reducing a threading dislocation.

The present invention is a nitride semiconductor light-emitting element including a substrate, a first nitride semiconductor layer provided on the substrate, a light-emitting layer provided on the first nitride semiconductor layer, and a second nitride semiconductor layer provided on the light-emitting layer, where the first nitride semiconductor layer includes a high concentration silicon-doped layer in which silicon is doped at a high concentration of at least $2 \times 10^{19}$ atoms/cm$^3$ and a dislocation reduction layer for laterally bending a threading dislocation on the high concentration silicon-doped layer. With such a configuration, the threading dislocation is reduced, so that a nitride semiconductor light-emitting element exhibiting improved characteristics can be provided.

According to the present invention, a nitride semiconductor light-emitting element can be provided which is capable of improving characteristics by reducing a threading dislocation.

DETAILED DESCRIPTION OF THE INVENTION

Figure 1:
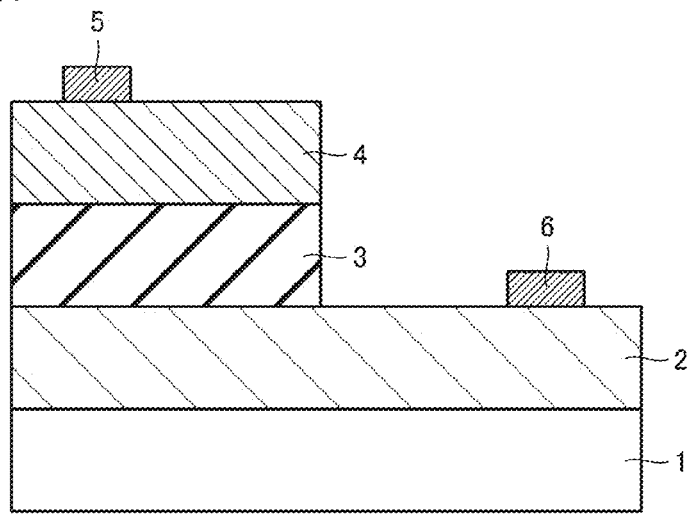
FIG. 1 is a cross-sectional view schematically representing a nitride semiconductor light-emitting diode element according to an embodiment.

In the following, an embodiment of the present invention will be described. In the drawings of the present invention, the same reference numerals represent the same parts or corresponding parts.

FIG. 1 is a cross-sectional view schematically representing a nitride semiconductor light-emitting diode element according to the embodiment as an example of a nitride semiconductor light-emitting element according to the present invention. As shown in FIG. 1, the nitride semiconductor light-emitting diode element according to the embodiment includes a substrate 1, a first nitride semiconductor layer 2 provided on substrate 1, a light-emitting layer 3 provided on first nitride semiconductor layer 2, and a second nitride semiconductor layer 4 provided on light-emitting layer 3. Moreover, a first electrode 6 is formed on first nitride semiconductor layer 2, and a second electrode 5 is formed on second nitride semiconductor layer 4. First nitride semiconductor layer 2, light-emitting layer 3, and second nitride semiconductor layer 4 can be formed through, for example, an MOCVD (metallorganic chemical vapor deposition) method or the like, and first electrode 6 and second electrode 5 can be formed through, for example, a vapor deposition method or the like.

Figure 2:
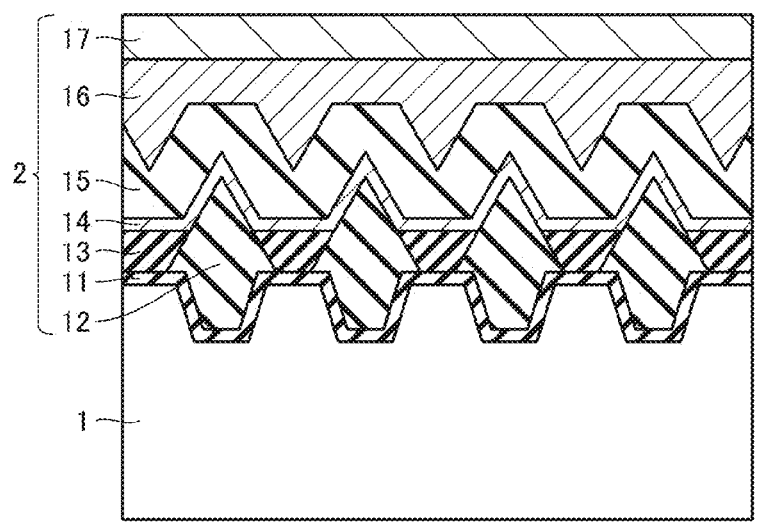
FIG. 2 is an enlarged cross-sectional view schematically representing the substrate and the first nitride semiconductor layer shown in FIG. 1.

FIG. 2 is an enlarged cross-sectional view schematically representing substrate 1 and first nitride semiconductor layer 2 shown in FIG. 1. As shown in FIG. 2, a buffer layer 11 is formed on a recessed and protruded surface of substrate 1, and an inclined facet layer 12 is formed on buffer layer 11 at recessed parts of substrate 1. Moreover, a first buried layer 13 is formed so as to fill a space of first inclined facet layer 12, and a high concentration silicon-doped layer 14 is formed on the surfaces of inclined facet layer 12 and first buried layer 13. Moreover, a dislocation reduction layer 15 is formed on high concentration silicon-doped layer 14, and a second buried layer 16 is formed on dislocation reduction layer 15. Further, a conductive layer 17 is formed on second buried layer 16.

For example, a silicon (Si) substrate, a sapphire ($Al_2O_3$) substrate, a silicon carbide (SiC) substrate, a spinel ($MgAl_2O_4$) substrate, or the like may be used for substrate 1. Among those substrates, it is preferable to use the sapphire substrate, which is inexpensive and transparent, as substrate 1. Moreover, as shown in FIG. 2 for example, when a recessed/protruded shape is provided on the surface of substrate 1 constituted of a sapphire substrate, a light-extraction efficiency of the nitride semiconductor light-emitting diode element according to the embodiment can be improved, and inclined facet layer 12 can be readily formed during an initial growth.

It is preferable that a GaN (gallium nitride) layer or an AlN (aluminum nitride) layer is used for buffer layer 11. When the GaN layer or the AlN layer is used for buffer layer 11, a nitride semiconductor layer with a low dislocation can be formed on buffer layer 11. Particularly, when the AlN layer is used for buffer layer 11, a screw dislocation of the nitride semiconductor layer grown on buffer layer 11 can be reduced effectively, so that both of two kinds of another dislocations having different Burgers vectors can be reduced. Therefore, the luminous efficiency of the nitride semiconductor light-emitting element can be improved.

For inclined facet layer 12, a nitride semiconductor expressed by the formula of, for example, $Al_{x1}Ga_{y1}In_{z1}N$ ($0 \leq x1 \leq 1$, $0 \leq y1 \leq 1$, $0 \leq z1 \leq 1$, $x1+y1+z1 \neq 0$) can be used.

For first buried layer 13, a nitride semiconductor expressed by the formula of, for example, $Al_{x2}Ga_{y2}In_{z2}N$ ($0 \leq x2 \leq 1$, $0 \leq y2 \leq 1$, $0 \leq z2 \leq 1$, $x2+y2+z2 \neq 0$) can be used.

For high concentration silicon-doped layer 14, a nitride semiconductor expressed by the formula of, for example, $Al_{x3}Ga_{y3}In_{z3}N$ ($0 \leq x3 \leq 1$, $0 \leq y3 \leq 1$, $0 \leq z3 \leq 1$, $x3+y3+z3 \neq 0$) and doped with Si at a high concentration of at least $2 \times 10^{19}$ atoms/cm$^3$ can be used. Moreover, for dislocation reduction layer 15, a nitride semiconductor expressed by the formula of for example, example, $Al_{x4}Ga_{y4}In_{z4}N$ ($0 \leq x4 \leq 1$, $0 \leq y4 \leq 1$, $0 \leq z4 \leq 1$, $x4+y4+z4 \neq 0$) can be used.

Forming high concentration silicon-doped layer 14 doped with Si at a high concentration of at least $2 \times 10^{19}$ atoms/cm$^3$ promotes a three-dimensional growth of the nitride semiconductor layer on high concentration silicon-doped layer 14, so that dislocation reduction layer 15 having an inclined facet can be formed. Forming dislocation reduction layer 15 having an inclined facet through the three-dimensional growth can laterally bend the threading dislocation formed due to a lattice mismatching between substrate 1 and the nitride semiconductor layer formed on substrate 1, so that dislocation reduction layer 15 can serve as a dislocation reduction layer. It is enough for dislocation reduction layer 15 to reduce at least one of the number of threading dislocations taken over to second buried layer 16 on dislocation reduction layer 15 by bending the threading dislocation from high concentration silicon-doped layer 14.

Moreover, it is preferable that Si changing the surface energy creeps up during the growth of dislocation reduction layer 15 to change a growth mode to the three-dimensional growth. Therefore, it is preferable that an Si concentration is reduced gradually and spread as proceeding in the growth direction (the side of the light-emitting layer) and that the Si concentration at a location of 1.5 μm from the surface of high concentration silicon-doped layer 14 on the side of light-emitting layer 3 toward the side of light-emitting layer 3 side is at least $1 \times 10^{17}$ atoms/cm$^3$. In this case, reduction of the dislocation in dislocation reduction layer 15 can be performed effectively. When the three-dimensional growth of dislocation reduction layer 15 is performed on high concentration silicon-doped layer 14, it is not necessary to intentionally dope dislocation reduction layer 15 with Si. Moreover, lowering of the Si concentration is all necessary to be, for example, continuous and/or stepwise.

Moreover, it is preferable that the thickness of high concentration silicon-doped layer 14 is not more than 0.5 μm. In this case, since a tensile stress is not imparted excessively to high concentration silicon-doped layer 14, the crystallinity of high concentration silicon-doped layer 14 can be favorable one.

Moreover, when dislocation reduction layer 15 is grown through the MOCVD method, setting a molar ratio of ammonia ($NH_3$) with respect to trimethyl gallium (TMG) to be not more than 250 increases a grain size of nitride semiconductor crystals constituting dislocation reduction layer 15 and reduces an association frequency of the grains, so that the dislocation can be reduced effectively.

The Si concentration in high concentration silicon-doped layer 14 can be obtained by, for example, SIMS (secondary ion mass spectrometry method) and the like. Moreover, the direction of the dislocation in dislocation reduction layer 15 can be obtained by observing dislocation reduction layer 15 by means of, for example, TEM (transmission electron microscope), STEM (scanning transmission electron microscope), or the like.

For second buried layer 16, a nitride semiconductor expressed by the formula of, for example, $Al_{x5}Ga_{y5}In_{z5}N$ ($0 \leq x5 \leq 1$, $0 \leq y5 \leq 1$, $0 \leq z5 \leq 1$, $x5+y5+z5 \neq 0$) can be used. However, in view of flattening the surface of second buried layer 16, it is preferable to dope second buried layer 16 with magnesium (Mg). Moreover, it is preferable that a concentration of Mg to be doped in second buried layer 16 is at least $5 \times 10^{18}$ atoms/cm$^3$ and not more than $5 \times 10^{19}$ atoms/cm$^3$. When the Mg concentration in second buried layer 16 is at least $5 \times 10^{18}$ atoms/cm$^3$ and not more than $5 \times 10^{19}$ atoms/ cm$^3$, the surface of second buried layer 16 can be flattened more, and a cloudiness of second buried layer 16 can be prevented effectively, so that favorable crystallinity can be obtained.

For conductive layer 17, a nitride semiconductor expressed by the formula of, for example, $Al_{x6}Ga_{y6}In_{z6}N$ ($0 \leq x6 \leq 1$, $0 \leq y6 \leq 1$, $0 \leq z6 \leq 1$, $x6+y6+z6 \neq 0$) and doped with n-type impurities can be used. For the n-type impurities, for example, Si and/or Ge (germanium) can be used.

Light-emitting layer 3 can be formed on conductive layer 17. For light-emitting layer 3, a nitride semiconductor expressed by the formula of, for example, $Al_{x7}Ga_{y7}In_{z7}N$ ($0 \leq x7 \leq 1$, $0 \leq y7 \leq 1$, $0 \leq z7 \leq 1$, $x7+y7+z7 \neq 0$) can be used. A wavelength of light emitting from light-emitting layer 3 can be adjusted suitably by suitably changing a composition of the nitride semiconductor constituting light-emitting layer 3 and changing a band gap. Under light-emitting layer 3, a multilayer film having a periodically changed band gap can be formed. Moreover, light-emitting layer 3 may employ either a single quantum well structure (SQW) or a multiple quantum well structure (MQW).

On light-emitting layer 3, second nitride semiconductor layer 4 constituted of a p-type nitride semiconductor can be formed. For second nitride semiconductor layer 4, a nitride semiconductor expressed by the formula of, for example, $Al_{x8}Ga_{y8}In_{z8}N$ ($0 \leq x8 \leq 1$, $0 \leq y8 \leq 1$, $0 \leq z8 \leq 1$, $x8+y8+z8 \neq 0$) and doped with p-type impurities can be used. For the p-type impurities, for example, Mg and/or Zn (zinc) can be used. Moreover, for second nitride semiconductor layer 4, a carrier block layer constituted of a p-type nitride semiconductor having a large band gap may be included, or a contact layer constituted of a p-type nitride semiconductor doped with p-type impurities at a high concentration may be included.

Figure 3:
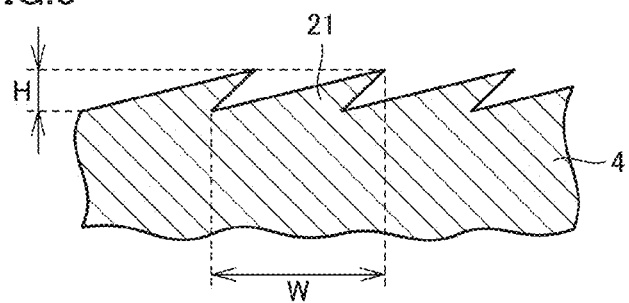
FIG. 3 is a cross-sectional view schematically illustrating macrosteps of the nitride semiconductor light-emitting diode element according to the embodiment.

On the surface of second nitride semiconductor layer 4 stacked as described above, for example, macrosteps 21 as shown in the schematic enlarged cross-sectional view of FIG. 3 are formed. Macrosteps 21 are formed at the moment of burying second buried layer 16 into dislocation reduction layer 15, and macrosteps 21 can increase a half band width of light emitted from light-emitting layer 3 without decreasing the luminous efficiency of the nitride semiconductor light-emitting element. Macrosteps 21 are surfaces inclined with respect to a growth surface, and are generated due to arrangement of high concentration silicon-doped layer 14.

For example, when a white LED (Light Emitting Diode) device is fabricated by setting the wavelength of light emitted from light-emitting layer 3 to be in a blue region and using green and red phosphors, the luminous wavelength of the phosphors is very broad. However, since the light-emitting wavelength of conventional blue light has a half band width of about 20 nm which is very narrow, there has been a problem of poor color reproducibility and poor color rendering property of blue light, and low safeness with respect to human eyes.

On the other hand, when macrosteps 21 broaden the luminous wavelength of blue light emitted from light-emitting layer 3, a white LED device with good reproductivity and good color rendering property of blue light, and high safeness with respect to human eyes can be obtained.

A dominant luminous wavelength (a short wavelength sensed when viewed by human eyes) of the nitride semiconductor light-emitting diode element according to the embodiment is preferably at least 420 nm and not more than 500 nm, and more preferably at least 430 nm and not more than 470 nm. In this case, human eyes sense that the color reproductivity and color rendering property of blue light emitted from light-emitting layer 3 are good, and safeness with respect to human eyes can be enhanced.

A half band width of electroluminescence light emission (light emitted from light-emitting layer 3 by infusion of electric current) of the nitride semiconductor light-emitting diode element according to the embodiment is preferably at least 25 nm. In this case, human eyes sense that the color reproductivity and color rendering property of blue light emitted from light-emitting layer 3 is good, and safeness with respect to human eyes can be enhanced.

The reason why providing macrosteps 21 broadens the luminous wavelength of blue light emitted from light-emitting layer 3 and widens the half band width is unknown. However, it is inferred that the surface having a portion inclined at a very low angle by macrosteps 21 slightly shifts the luminous wavelength of that portion to broaden the luminous wavelength, and thereby widen the half band width.

Moreover, it is preferable that a height H of macrostep 21 is at least 20 nm and not more than 300 nm. When height H of macrostep 21 is at least 20 nm, the luminous wavelength of light emitted from light-emitting layer 3 can be broadened, and the half band width can also be widened. Moreover, when height H of macrostep 21 is not more than 300 nm, there is a tendency that lowering of the luminous efficiency of the nitride semiconductor light-emitting diode element according to the embodiment can be suppressed.

Moreover, a lateral width W of macrostep 21 is preferably at least 40 µm and not more than 300 µm. When lateral width W of macrostep 21 is at least 40 µm, there is a tendency that lowering of the luminous efficiency of the nitride semiconductor light-emitting diode element according to the embodiment can be suppressed. Moreover, when lateral width W of macrostep 21 is not more than 300 µm, the luminous wavelength of light emitted from light-emitting layer 3 can be broadened, and the half band width can also be widened.

Height H and lateral width W of macrostep 21 can be measured by tracing the surface of conductive layer 17 with a step profiler.

On the surface of second nitride semiconductor layer 4, a conductive oxidized film made of ITO (Indium Tin Oxide) can be formed. When the conductive oxidized film is formed, second electrode 5 as a p-electrode is formed on the conductive oxidized film, and the surface of conductive layer 17 is exposed through mesa etching, and thereafter first electrode 6 as an n-electrode is formed on the exposed surface of conductive layer 17. Moreover, a metal wire can be bonded on first electrode 6 and second electrode 5.

Example 1

Figure 4:
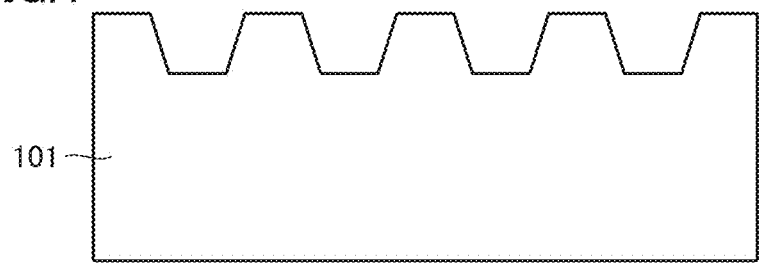
FIG. 4 is a cross-sectional view schematically illustrating a manufacturing step of a template substrate according to Example 1.

Firstly, as shown in the schematic cross-sectional view of FIG. 4, recessions and projections are formed on the surface of a sapphire substrate 101. Here, the recessions and projections on the surface of sapphire substrate 101 were formed by patterning a resist by means of a stepper or the like on the surface of flat sapphire substrate 101, and etching by means of ICP (Inductively Coupled Plasma).

Figure 5:
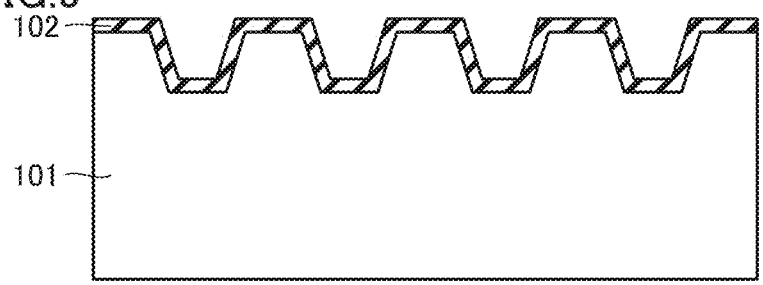
FIG. 5 is a cross-sectional view schematically illustrating a manufacturing step of the template substrate according to Example 1.

Next, sapphire substrate 101 was set in a spatter film-producing device, and nitrogen gas was allowed to flow into the spatter film-producing device, so that the surface of sapphire substrate 101 was nitridized. After that, while setting the temperature to be 500° C., and holding the pressure in the spatter film-producing device at 0.5 Pa, and 5 sccm of nitrogen gas was allowed to flow into the spatter film-producing device, a high frequency bias was applied to the side of a metal Al target. Accordingly, as shown in the schematic cross-sectional view shown in FIG. 5, an AlN film 102 was formed on the surface of sapphire substrate 101 through a spattering method.

Figure 6:
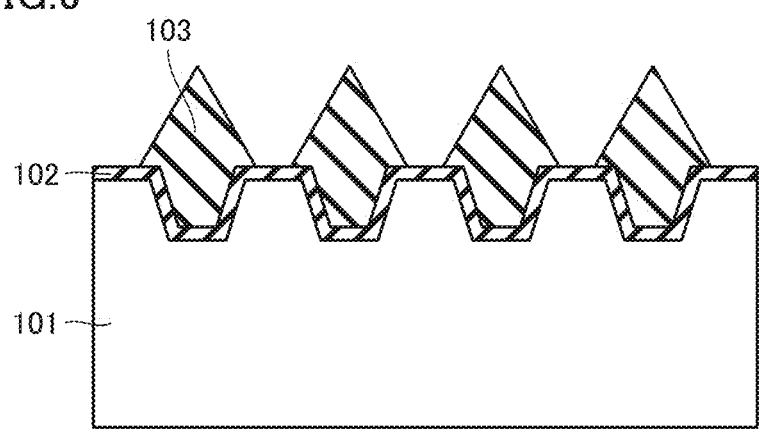
FIG. 6 is a cross-sectional view schematically illustrating a manufacturing step of the template substrate according to Example 1.

After cooling sapphire substrate 101, sapphire substrate 101 having AlN film 102 formed thereon was set in a reactor of the MOCVD device. After that, $NH_3$ as a V-group source and TMG as a III-group source are supplied to the reactor of the MOCVD device at a temperature of 990° C., so that an inclined facet layer 103 made of GaN having an inclined facet with a height of 1.7 μm was formed through the MOCVD method, as shown in the cross-sectional view of FIG. 6. At this time, an angle of the inclined facet of inclined facet layer 103 was about 60° with respect to the growth surface. Moreover, inclined facet layer 103 was grown only on the upper surface of the recessions of the recessions and protrusions on the surface of sapphire substrate 101.

Figure 7:
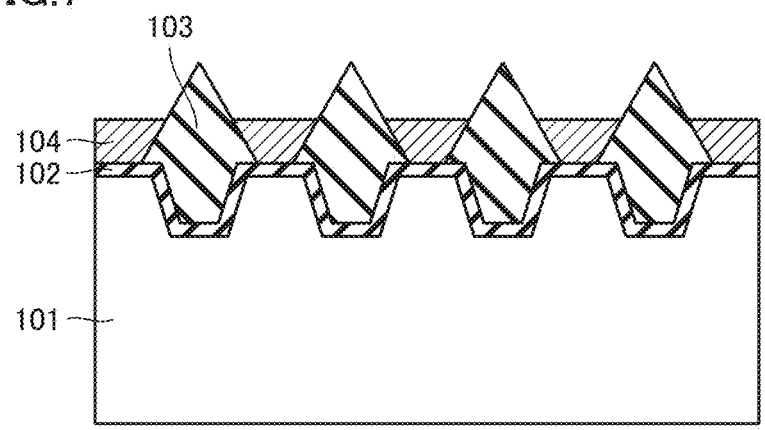
FIG. 7 is a cross-sectional view schematically illustrating a manufacturing step of the template substrate according to Example 1.

Next, $NH_3$ as a V-group source and TMG as a III-group source were supplied at a temperature of 1200° C. in the manner similar to that described above, and first buried layer 104 made of GaN was buried into the recessed parts in inclined facet layer 103 through the MOCVD method, as shown in the schematic cross-sectional view of FIG. 7. The thickness of first buried layer 104 was 0.5 μm, and first buried layer 104 was buried in inclined facet layer 103 on partway.

Figure 8:
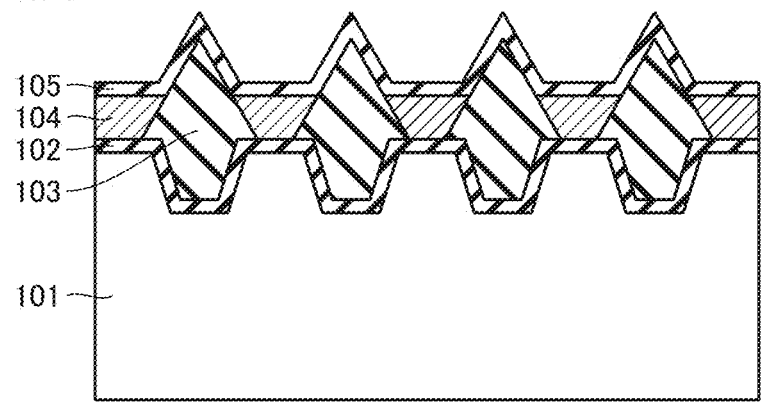
FIG. 8 is a cross-sectional view schematically illustrating a manufacturing step of the template substrate according to Example 1.

Next, the supply of TMG was stopped, and $SiH_4$ as a IV-group source and $NH_3$ as a V-group source were supplied at a temperature of 1255° C. for 19.5 minutes, so that a high concentration silicon-doped layer 105 was grown on the surfaces of inclined facet layer 103 and first buried layer 104 through the MOCVD method, as shown in the schematic cross-sectional view of FIG. 8.

Figure 9:
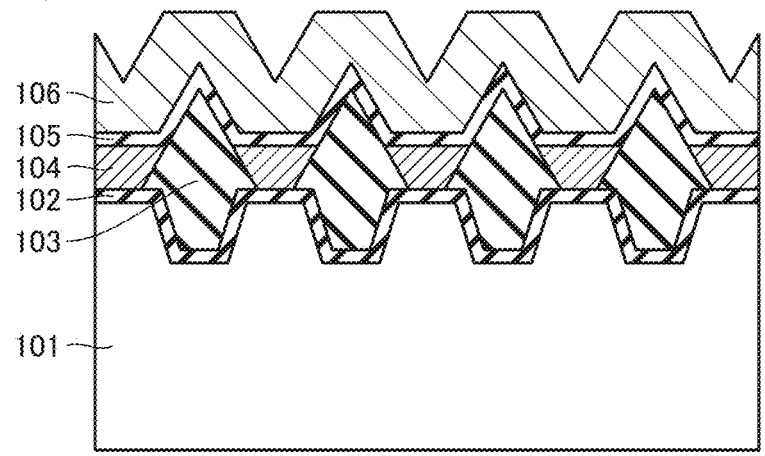
FIG. 9 is a cross-sectional view schematically illustrating a manufacturing step of the template substrate according to Example 1.

Next, in the state of maintaining the temperature, the supply of $SiH_4$ was stopped, and $NH_3$ as a V-group source and TMG as a III-group source were supplied, so that a molar ratio of $NH_3$ with respect to TMG became 120, and a dislocation reduction layer 106 made of GaN having an inclined facet was grown in the three-dimensional manner on high concentration silicon-doped layer 105 through the MOCVD method at a thickness of 3 μm, as shown in the schematic cross-sectional view of FIG. 9.

Figure 10:
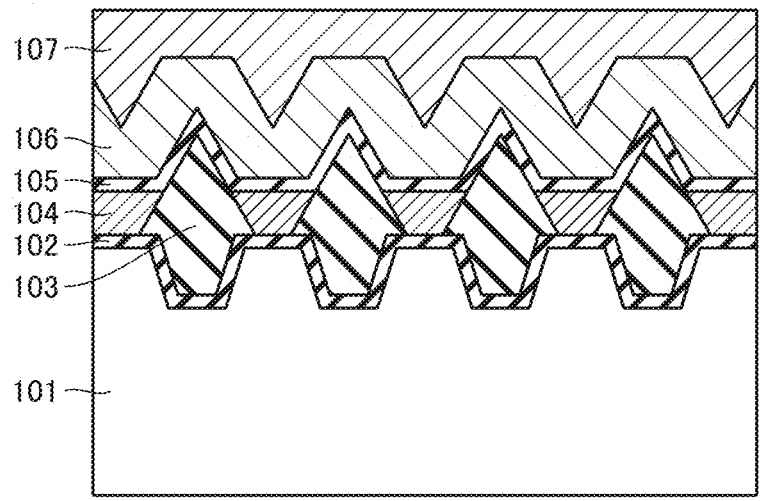
FIG. 10 is a cross-sectional view schematically illustrating a manufacturing step of the template substrate according to Example 1.

Next, in the state of maintaining the temperature, $NH_3$ as a V-group source, TMG as a III-group source, and $CP_2Mg$ (cyclopentadienyl magnesium) as a II-group source were supplied, so that a second buried layer 107 made of Mg-doped P-type GaN was grown through the MOCVD method on the surface of dislocation reduction layer 106, as shown in the schematic cross-sectional view of FIG. 10. Here, a molar ratio of $NH_3$ with respect to TMG was adjusted to 440, and an Mg concentration of second buried layer 107 was set to be $2\times10^{19}$ atoms/cm$^3$, and the thickness of second buried layer 107 was set to be 2.2 μm.

Figure 11:
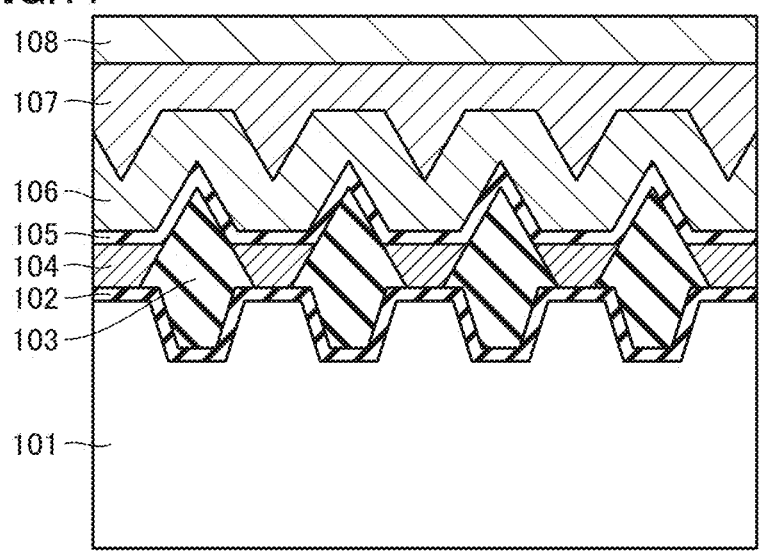
FIG. 11 is a cross-sectional view schematically illustrating a manufacturing step of the template substrate according to Example 1.

Next, in the state of maintaining the temperature, the supply of $CP_2Mg$ was stopped, and $NH_3$ as a V-group source, TMG as a III-group source, and $SiH_4$ as a IV-group source were supplied, so that a conductive layer 108 made of Si-doped n-type GaN was grown through the MOCVD method on the surface of second buried layer 107, as shown in the schematic cross-sectional view of FIG. 11. Here, an Si concentration in conductive layer 108 was set to be $5\times10^{18}$ atoms/cm$^3$, and the thickness of conductive layer 108 was set to be 0.5 μm.

Through the steps described above, a template substrate according to Example 1 was fabricated which has a first nitride semiconductor layer stacked on the sapphire substrate. All the temperatures described above represent thermocouple temperatures in contact with a carbon susceptor.

Figure 12:
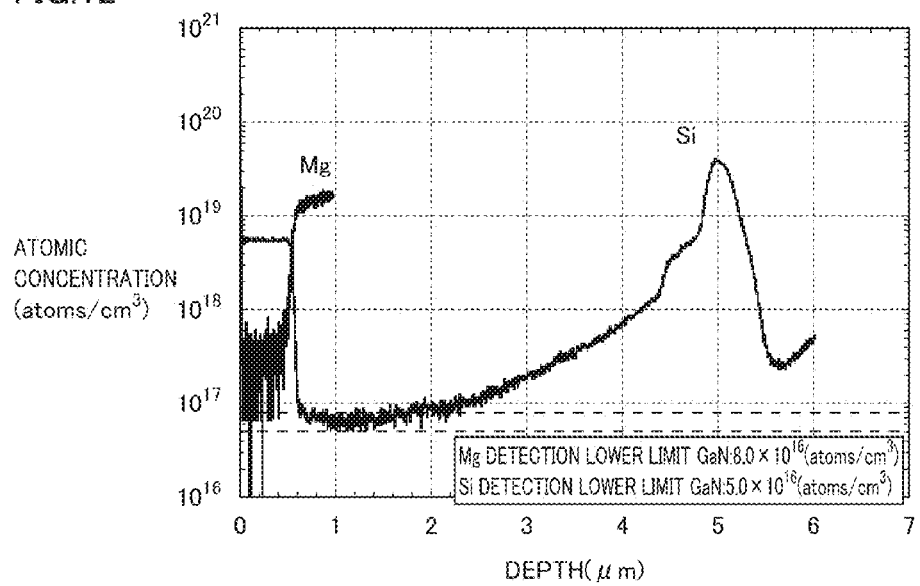
FIG. 12 represents a result of analysis for the template substrate according to Example 1 by means of SIMS.
Figure 13:
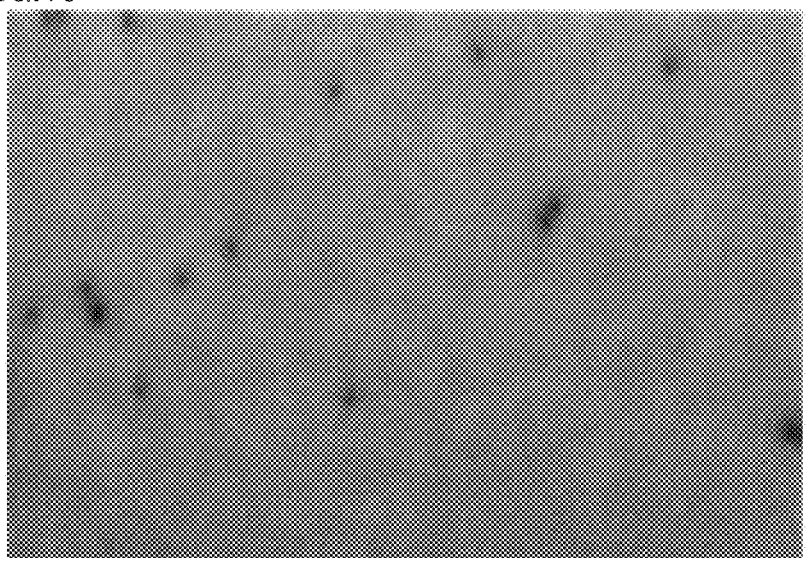
FIG. 13 represents a CL image of the template substrate according to Example 1.
Figure 14:
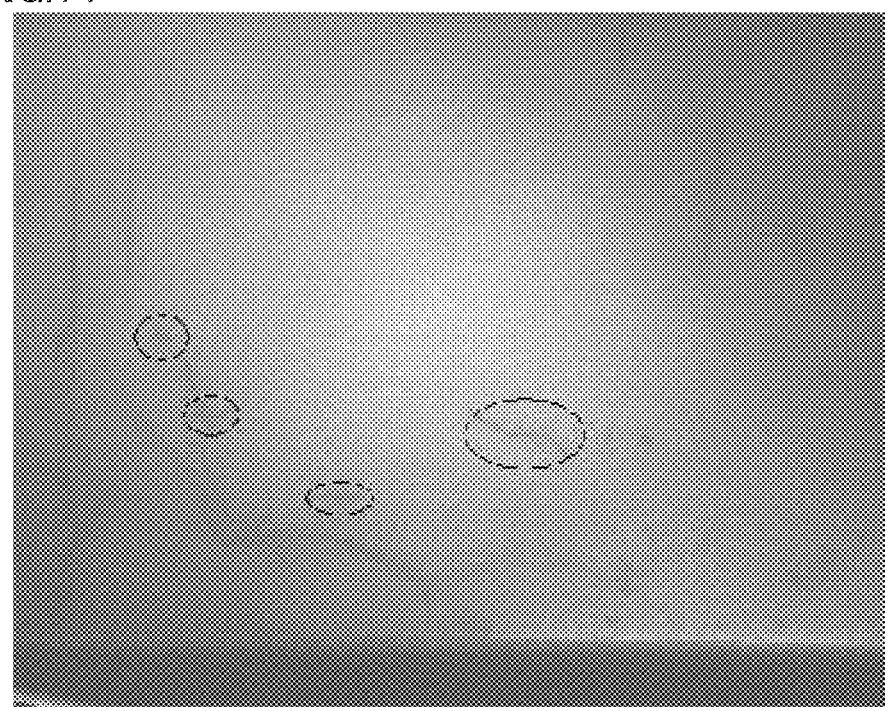
FIG. 14 represents a STEM image of the template substrate according to Example 1.

FIG. 12 represents a result of analysis for the template substrate according to Example 1 by means of SIMS, and FIG. 13 represents a CL (cathode luminescence) image of the template substrate according to Example 1, and FIG. 14 represents an STEM image of the template substrate according to Example 1.

As shown in the result of analysis by means of SIMS of FIG. 12, it was confirmed that Si was incorporated into the template substrate according to Example 1 when high concentration silicon-doped layer 105 was formed, and dispersion of Si in the growth direction promotes the three dimensional growth of dislocation reduction layer 106.

Moreover, as shown in the STEM image of FIG. 14, it was confirmed that the dislocation is laterally bent in dislocation reduction layer 106, and dislocations having different Burgers vectors associate and form a half-loop to be eliminated, so that the dislocation is reduced. Consequently, as shown in the CL image of the template substrate according to Example 1 of FIG. 13, the dislocation which was conventionally about $1\times10^8$ atoms/cm$^2$ can be reduced to about $1\times10^7$ atoms/cm$^2$.

Moreover, it was confirmed that, when Mg was not supplied during formation of second buried layer 107, second buried layer 107 does not become flat, and a pit was formed. Thus, it was confirmed that supplying Mg during formation of second buried layer 107 promotes flattening of the surface of second buried layer 107.

Example 2

A nitride semiconductor light-emitting diode element according to an Example 2 was fabricated by forming a light-emitting layer and a second nitride semiconductor layer on the template substrate of Example 1.

Figure 15:
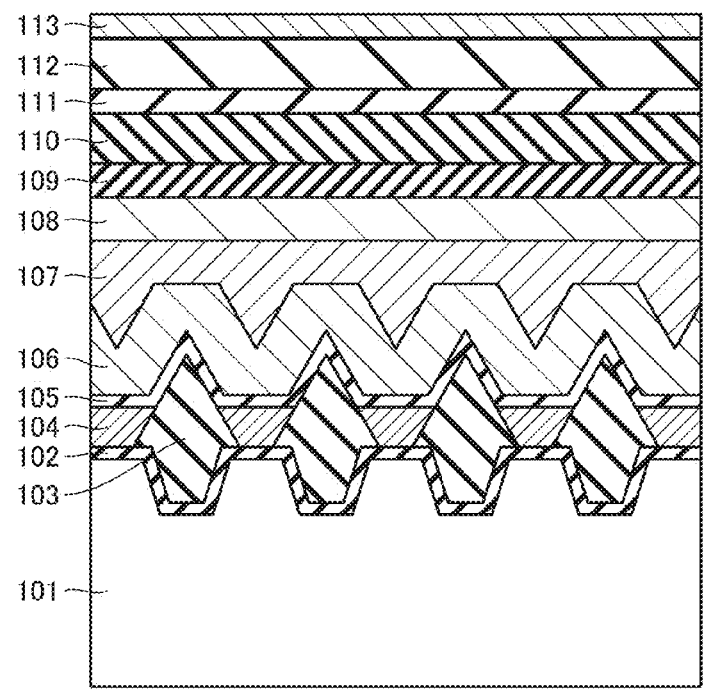
FIG. 15 is a cross-sectional view schematically illustrating a manufacturing step of a nitride semiconductor light-emitting diode element according to Example 2.

Firstly, the template substrate according to Example 1 was set in the MOCVD device, and the Si-doped n-type GaN was further grown through the MOCVD method at a temperature of 1255° C. to set the thickness of conductive layer 108 to be 3 μm, as shown in the schematic cross-sectional view of FIG. 15. Next, the temperature was lowered to 938° C., and GaN layers each having a thickness of 1.5 nm and InGaN layers each having a thickness of 1.5 nm were grown alternately one after another for twenty cycles, so that a superlattice layer 109 was grown through the MOCVD method on conductive layer 108.

Next, the temperature was lowered to 816° C., and GaN barrier layers each having a thickness of 7.5 nm and InGaN well layers each having a thickness of 3 nm were grown alternately one after another for six cycles, so that a light-emitting layer 110 was grown through the MOCVD method on superlattice layer 109.

Next, the temperature was raised to 1223° C., and a carrier block layer 111 having a three-layer structure constituted of an undoped AlGaN layer, an Mg-doped p-type AlGaN layer, and an undoped AlGaN layer was grown through the MOCVD method on light-emitting layer 110 to have a thickness of 20 nm.

Next, in the state of maintaining the temperature, an undoped GaN layer 112 having a thickness of 65 nm was grown through the MOCVD method on carrier block layer 111. Next, the temperature was raised to 1238° C., and a contact layer 113 constituted of an Mg-doped p-type GaN having a thickness of 20 nm was grown through the MOCVD method on undoped GaN layer 112.

Next, after the template substrate according to Example 1 having contact layer 113 formed thereon was taken out from the MOCVD device, and heat treatment is performed at 800° C. in an annealing furnace for performing annealing of activating Mg as p-type impurities, the surface of contact layer 113 was cleaned by fluoric acid.

Figure 16:
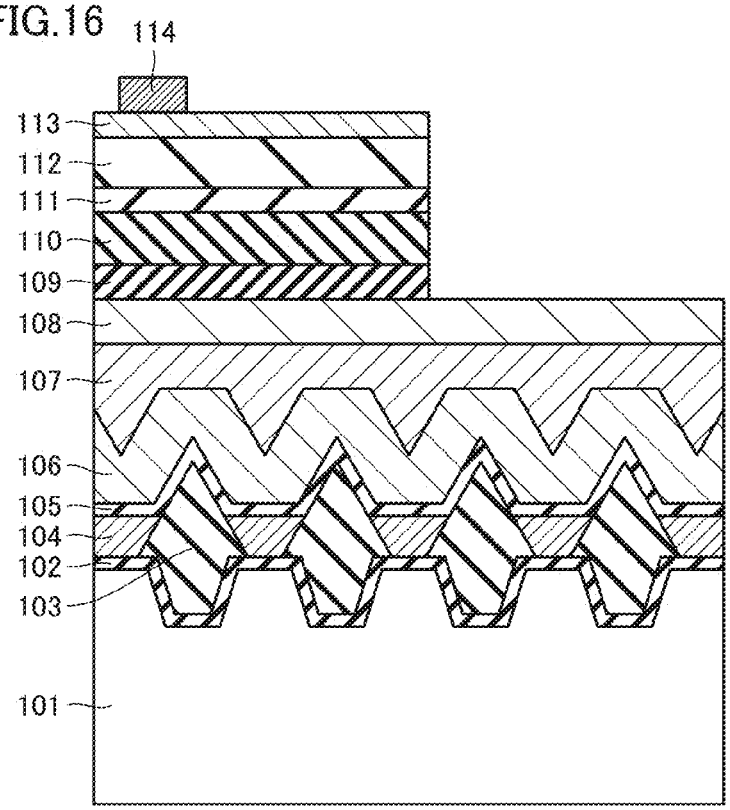
FIG. 16 is a cross-sectional view schematically illustrating a manufacturing step of the nitride semiconductor light-emitting diode element according to Example 2.

After that, as shown in the schematic cross-sectional view of FIG. 16, Pd electrode 114 as a p-electrode was deposited on contact layer 113, and the wafer end was cut by a diamond pen to expose the surface of conductive layer 108, so that the nitride semiconductor light-emitting diode element according to Example 2 was completed.

Then, Pd electrode 114 of the nitride semiconductor light-emitting diode element according to Example 2 and the surface of conductive layer 108 exposed by cutting the wafer end are probed by a prober, so that an emission spectrum was measured by means of an instant multi-photometry system, and an intensity was measured by means of a photodetector, from the back surface of the nitride semiconductor light-emitting diode element according to Example 2.

For comparison, the template substrate fabricated in a manner similar to that of Example 1, except for not forming high concentration silicon-doped layer 105, was set in the MOCVD device simultaneously with the template according to Example 1, and a nitride semiconductor light-emitting diode element according to a Comparative Example was fabricated under conditions which are similar to those described above.

Consequently, it was confirmed that the nitride semiconductor light-emitting diode element according to Example 2 fabricated with use of the template substrate according to Example 1 including high concentration silicon-doped layer 105 had an optical output increased by 12% as compared to the nitride semiconductor light-emitting diode element fabricated with use of the template substrate not including high concentration silicon-doped layer 105.

Moreover, although the luminous wavelengths of the nitride semiconductor light-emitting diode element according to Example 2 and the nitride semiconductor light-emitting diode element according to Comparative Example were changed in accordance with a current density, the luminous wavelength at the current density of 10 A/cm$^2$ was 445 nm for both.

Moreover, a half band width of electroluminescence light emission of the nitride semiconductor light-emitting diode element according to Example 2 at a current density of 10 A/cm$^2$ was 29.8 nm, and a half band width of electroluminescence light emission of the nitride semiconductor light-emitting diode element according to Comparative Example at a current density of 10 A/cm$^2$ was 21.5 nm. Thus, it was confirmed that the half band width of the electroluminescence light emission of the nitride semiconductor light-emitting diode element according to Example 2 was very broad as compared to the nitride semiconductor light-emitting diode element according to Comparative Example. Moreover, as a result of using a step profiler to measure a height and a lateral width of a macrostep on the surface of contact 113 of the nitride semiconductor light-emitting diode element according to Example 2, it was confirmed that the height was at least 20 nm and not more than 100 nm, and the lateral width was at least 40 μm and not more than 150 μm.

Figure 17:
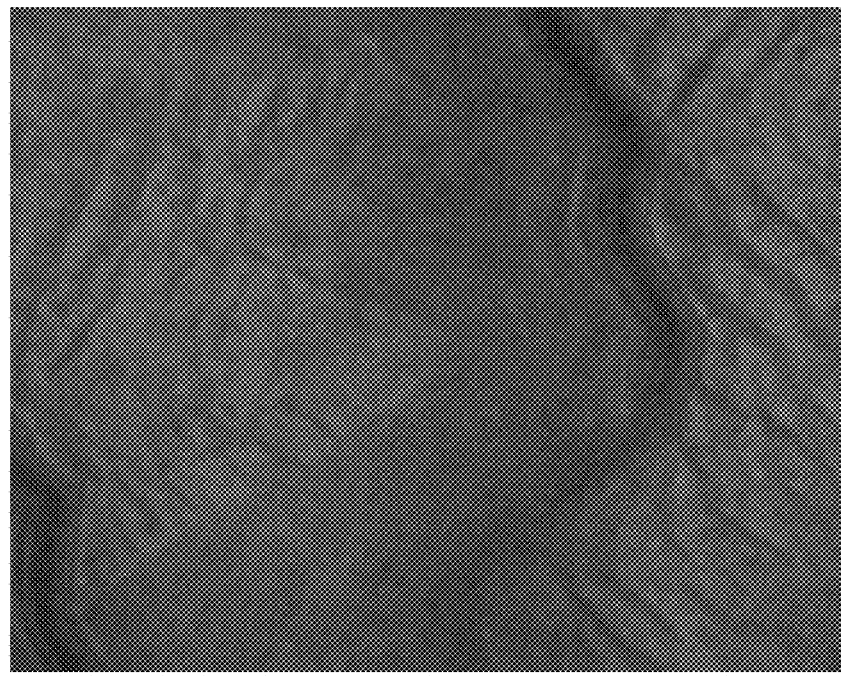
FIG. 17 represents a PL light-emitting pattern on a surface of a contact layer of the nitride semiconductor light-emitting diode element according to Example 2.

Further, FIG. 17 represents a PL (Photo Luminescence) light-emitting pattern on the surface of contact 113 of the nitride semiconductor light-emitting diode element according to Example 2. As indicated by the PL light-emitting pattern shown in FIG. 17, the edge of the macrostep was observed.

It was confirmed that, as described above, in the nitride semiconductor light-emitting diode element according to Example 2 having high concentration silicon-doped layer 105 formed thereon, as compared to the nitride semiconductor light-emitting diode element according to Comparative Example, the threading dislocation can be reduced by dislocation reduction layer 106 grown on high concentration silicon-doped layer 105, so that the luminous wavelength is broadened, and the half band width of the electroluminescence light emission is widened.

Accordingly, with use of the nitride semiconductor light-emitting diode element according to Example 2 and the green and red phosphors, a white LED device with good reproductivity and good color rendering property of blue light, and high safeness with respect to human eyes can be fabricated.

Further, when the nitride semiconductor light-emitting diode element according to Example 2 is used, a white LED device can be fabricated which is not lowered in the luminous efficiency and not reduced in the luminous flux.

The present invention is a nitride semiconductor light-emitting element including a substrate, a first nitride semiconductor layer provided on the substrate, a light-emitting layer provided on the first nitride semiconductor layer, and a second nitride semiconductor layer provided on the light-emitting layer, where the first nitride semiconductor layer includes a high concentration silicon-doped layer in which silicon is doped at a high concentration of at least $2\times10^{19}$ atoms/cm$^3$, and a dislocation reduction layer for laterally bending a threading dislocation on the high concentration silicon-doped layer. With such a configuration, a nitride semiconductor light-emitting element can be provided which exhibits improved characteristics by reducing the threading dislocation.

Here, in the nitride semiconductor light-emitting element according to the present invention, it is preferable that a silicon concentration is lowered from the high concentration silicon-doped layer toward a side of the light-emitting layer, and a silicon concentration at a part of 1.5 μm from a surface of the high concentration silicon-doped layer on a side of the light-emitting layer toward a side of the light-emitting layer is at least $1\times10^{17}$ atoms/cm$^3$. With such a configuration, reduction of the dislocation in the dislocation reduction layer can be performed effectively.

Moreover, in the nitride semiconductor light-emitting element according to the present invention, it is preferable that a thickness of the high concentration silicon-doped layer is not more than 0.5 μm. With such a configuration, a tensile stress is not applied excessively to the high concentration silicon-doped layer, so that favorable crystallinity of the high concentration silicon-doped layer can be obtained.

Moreover, in the nitride semiconductor light-emitting element according to the present invention, it is preferable that a layer containing magnesium is arranged between the dislocation reduction layer and the light-emitting layer. With such a configuration, the surface of the layer containing magnesium can be flattened.

Moreover, in the nitride semiconductor light-emitting element according to the present invention, it is preferable that a magnesium concentration in the layer containing magnesium is at least $5\times10^{18}$ atoms/cm$^3$ and not more than $5\times10^{19}$ atoms/cm$^3$. With such a configuration, the surface of the layer containing magnesium can be flattened.

Moreover, the nitride semiconductor light-emitting element according to the present invention includes a macrostep having a height of at least 20 nm and not more than 300 nm and a lateral width of at least 40 μm and not more than 300 µm. With such a configuration, lowering of the luminous efficiency in the nitride semiconductor light-emitting diode element is suppressed, so that the luminous wavelength of light emitted from the light-emitting layer is broadened, and the half band width can be widened.

Moreover, it is preferable that the nitride semiconductor light-emitting element according to the present invention is a nitride semiconductor light-emitting diode element having a dominant luminous wavelength of at least 420 nm and not more than 500 nm. With such a configuration, human eyes sense that the color reproductivity and color rendering property of blue light emitted from the light-emitting layer are good, and the safeness with respect to human eyes can be enhanced.

Moreover, it is preferable that the nitride semiconductor light-emitting element according to the present invention is a nitride semiconductor light-emitting diode element having a dominant luminous wavelength of at least 430 nm and not more than 470 nm. With such a configuration, human eyes sense that the color reproductivity and color rendering property of blue light emitted from the light-emitting layer are good, and the safeness with respect to human eyes can be enhanced.

Moreover, in the nitride semiconductor light-emitting element according to the present invention, it is preferable that the half band width of the electroluminescence light emission is at least 25 nm. With such a configuration, human eyes sense that the color reproductivity and color rendering property of blue light emitted from light-emitting layer 3 are good, and the safeness with respect to human eyes can be enhanced.

Moreover, in the nitride semiconductor light-emitting element according to the present invention, it is preferable that a layer in contact with the substrate of the first nitride semiconductor layer is an aluminum nitride layer. With such a configuration, the screw dislocation of the nitride semiconductor layer grown on the aluminum nitride layer can be reduced effectively, and both of another dislocations having two different kinds of Burgers vectors can be reduced, so that the luminous efficiency of the nitride semiconductor light-emitting element can be improved.

Further, the present invention is a method for manufacturing any one of the nitride semiconductor light-emitting elements described above, and the method includes the steps of forming a first nitride semiconductor layer on a substrate, forming a light-emitting layer on the first nitride semiconductor layer, and forming a second nitride semiconductor layer provided on the light-emitting layer, where the step of forming a first nitride semiconductor layer includes the steps of forming a high concentration silicon-doped layer on the substrate, and forming a dislocation reduction layer on the high concentration silicon-doped layer, and the dislocation reduction layer is formed through a metallorganic chemical vapor deposition method with a molar concentration of a V-group source with respect to a III-group source is not more than 250.

While the embodiment and examples of the present invention are described above, appropriate combinations of the embodiment and examples described above are originally expected.

It should be understood that the embodiments and examples disclosed herein are illustrative and non-restrictive in every respect. The scope of the present invention is defined by the terms of claims, and is intended to include any modifications within the scope and meaning equivalent to the terms of the claims.

The present invention can be used for a nitride semiconductor light-emitting element, and particularly used for a nitride semiconductor light-emitting diode element in a favorable manner.

REFERENCES SIGNS LIST

1 substrate; 2 first nitride semiconductor layer; 3 light-emitting layer; 4 second nitride semiconductor layer; 5 second electrode; 6 first electrode; 11 buffer layer; 12 inclined facet layer; 13 first buried layer; 14 high concentration silicon-doped layer; 15 dislocation reduction layer; 16 second buried layer; 17 conductive layer; 21 macrostep; 101 sapphire substrate; 102 AlN film; 103 inclined facet layer; 104 first buried layer; 105 high concentration silicon-doped layer; 106 dislocation reduction layer; 107 second buried layer; 108 conductive layer; 109 superlattice layers; 110 light-emitting layer; 111 carrier block layer; 112 undoped GaN layer; 113 contact layer; 114 pd-electrode.

The invention claimed is:

1. A nitride semiconductor light-emitting element comprising:
    a substrate;
    a first nitride semiconductor layer provided on said substrate;
    a light-emitting layer provided on said first nitride semiconductor layer; and
    a second nitride semiconductor layer provided on said light-emitting layer,
    wherein said first nitride semiconductor layer includes a high concentration silicon-doped layer in which silicon is doped at a high concentration of at least $2\times10^{19}$ atoms/cm$^3$ and a dislocation reduction layer for laterally bending a threading dislocation on said high concentration silicon-doped layer and having a bottom surface facing the high concentration silicon-doped layer and a top surface facing the light-emitting layer, and
    a silicon concentration in the dislocation reduction layer is lowered gradually from the high concentration of the high concentration silicon-doped layer toward the light-emitting layer, so that the silicon concentration in the dislocation reduction layer is higher at the bottom surface of the dislocation reduction layer than at the top surface of the dislocation reduction layer, and so that a silicon concentration in the dislocation reduction layer at a portion 1.5 µm away from a surface of the high concentration silicon-doped layer, which is on a side of said light-emitting layer, toward the light-emitting layer is at least $1\times10^{17}$ atoms/cm$^3$.

2. The nitride semiconductor light-emitting element according to claim 1, wherein a thickness of said high concentration silicon-doped layer is not more than 0.5 µm.

3. The nitride semiconductor light-emitting element according to claim 1, wherein a layer containing magnesium is arranged between said dislocation reduction layer and said light-emitting layer.

4. The nitride semiconductor light-emitting element according to claim 1, wherein a macrostep is included which has a height of at least 20 nm and not more than 300 nm, and a lateral width of at least 40 µm and not more than 300 µm.

5. The nitride semiconductor light-emitting element according to claim 1, wherein the nitride semicondcutor light-emitting element further comprises an inclined facet layer and a buried layer to fill a space of the inclined facet layer, and the high concentration silicon-doped layer is disposed on the inclined facet layer and the buried layer.

* * * * *